(12) United States Patent
Tokunaga

(10) Patent No.: US 6,436,594 B2
(45) Date of Patent: Aug. 20, 2002

(54) ELECTRON-BEAM EXPOSURE METHOD UTILIZING SPECIFIC ALIGNMENT MASK SELECTION

(75) Inventor: Kenichi Tokunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/730,546

(22) Filed: Dec. 7, 2000

(30) Foreign Application Priority Data

Dec. 10, 1999 (JP) ............................ 11-351080

(51) Int. Cl.⁷ .............................. G03F 9/00; G03C 5/00
(52) U.S. Cl. ........................... 430/22; 430/30; 430/296; 430/942
(58) Field of Search ............................ 430/22, 30, 296, 430/942

(56) References Cited

U.S. PATENT DOCUMENTS 5,315,123 A  5/1994  Itoh et al. ................ 250/492.2

FOREIGN PATENT DOCUMENTS

| JP | 61-142740 | 6/1986 |
|----|-----------|--------|
| JP | 2788139   | 6/1998 |

*Primary Examiner*—Christopher G. Young
(74) *Attorney, Agent, or Firm*—Foley & Lardner

(57) ABSTRACT

A disclosed method comprises a step of detecting a plurality of alignment marks A through D on a wafer before a pattern is exposed to obtain a correction factor in order to, based on it, performing alignment, starting pattern exposure to detect an alignment mark A' again at predetermined timing during a course of exposure, obtaining a positional difference between thus detected position and a position (coordinates) thereof detected before exposure to provide it as an electron-beam positional drift amount, and superimposing this electron-beam positional drift amount onto a deflection amount of an electron-beam, to correct electron-beam exposure position.

5 Claims, 7 Drawing Sheets

202; scanning electron beam

ELECTRON-BEAM EXPOSURE METHOD UTILIZING SPECIFIC ALIGNMENT MASK SELECTION

BACKGROUND OF THE INVENTION

1. Field of the Invention

The invention relates to an electron-beam exposure method and, more particularly to, such the electron-beam exposure method as to perform electron-beam exposure by correcting an exposure position when a pattern is directly drawn on a semiconductor wafer using an electron-beam exposure apparatus.

The present application claims priority of Japanese Patent Application No. Hei 11-351080 filed on Dec. 10,1999, which is hereby incorporated by reference.

2. Description of the Related Art

FIG. 6 shows an electron-beam exposure apparatus to which a conventional electron-beam exposure method is applied.

An electron-beam exposure apparatus 100 comprises an electron gun 101 for emitting an electron-beam, a first aperture 102 for restricting an amount of the electron-beam emitted from the electron gun 101, the beam shaping deflector 103 for deflecting the electron-beam from the first aparture 102, a second aperture 104 for further restricting an amount of the electron-beam from the beam shaping deflector 103, a reducing lens 105 for reducing the electron-beam from the second aperture 104, an objective lens 106 for focusing, for image formation, the electron-beam from the reducing lens 105 on a semiconductor wafer, (hereinafter simply to as wafer) 200, an alignment deflector 107 (main deflector) disposed inside the objective lens 106, for deflecting the electron-beam in a predetermined direction, a reflected electron detector 108 for detecting an electron reflected from the surface of the wafer 200, an X/Y stage 109 for loading thereon the wafer 200 to position it in X-axis direction and Y-axis direction, a cabinet 110 for housing all of these components, a alignment deflector control unit 111 for controlling the alignment deflector 107, and a stage control unit 112 for controlling the X/Y stage.

The reflected electron detector 108 uses a diode detector to trap a reflected electron (that is, secondary electron) from the reflective wafer surface when electrons are applied onto an alignment mark formed as a recess in the wafer 200, thus detecting a position of the alignment mark based on a difference between an amount of reflection from the alignment mark and that from its surrounding.

A pattern of the electron-beam from the electron gun 101 is determined through the first and second apertures 102 and 104 having their respective predetermined shapes of openings and the beam shaping deflector 103 and is reduced by the reducing lens 105 to a 1/n scale and then focused by the objective lens 106 onto the wafer 200. In addition, the electron-beam is positioned by the alignment deflector 107 and applied onto the wafer 200 set on the X/Y stage 109. This wafer 200 is positioned to a predetermined place by the X/Y stage 109. The beam shaping deflector 103, the objective lens 106, the alignment deflector 107, or like are adjusted using a reference pattern (not shown) provided on the X/Y stage 109. Drawing pattern data or like are stored in a memory 113 or 114 or a dedicated memory (not shown) or like. The alignment deflector 107 uses the drawing pattern data read out, to thereby control the alignment deflector 107, so that a scanning electron-beam (that is, electron-beam deflected corresponding to the drawing pattern data) may be deflected by the alignment deflector 107, thus drawing a pattern. At this point in time, on the wafer 200, the alignment mark formed thereon has been scanned by the scanning electron-beam prior to pattern drawing, and a resultant reflected electron is detected to thereby find the position of the alignment mark. The alignment mark is thus found and, based on this, the pattern is drawn, to provide drawing on a desired place on the wafer 200, thus avoiding misalignment even in a case where a plurality of drawing patterns is superposed one on top of another.

FIG. 7 shows a plurality of alignment marks provided on the wafer 200. FIG. 8, on the other hand, shows a waveform of a detection signal obtained by the reflected electron detector 108. An alignment mark 201 is cross shaped. The alignment mark 201 is detected when it is scanned by a scanning electron-beam 202 in both X-axis and Y-axis directions in the FIG. 8. When the alignment mark 201 is thus detected, then the wafer 200 is moved by the X/Y stage so that the alignment mark 201 may be positioned at a deflection center of the electron-beam. The alignment mark 200 is scanned actually, for example, by the electron-beam shaped into approximately a 1 $\mu$m×1 $\mu$m square (may be rectangular) through the first and second apertures 102 and 104 and also by the beam shaping deflector 103. During the scanning, a reflected electron resulting from electron-beam scanning is detected by the reflected electron detector 108. In this case, based on differences in step or material of the alignment mark 201, various reflected electron signals are obtained, such as that having a detected waveform 203 (obtained by X-axis directional scanning) shown in FIG. 8. Such reflected electron signal can be differentiated and then processed by an edge method or a symmetry method, to determine location of the alignment mark.

When a plurality of alignment marks such as shown in FIG. 7 is detected, based on the results of detection a shift in chip layout, a gain (magnification), and a rotation (degree of rotation) are calculated. An error in a chip array is corrected based on these calculation results. This method is referred to as a global alignment method. At a same time, as necessary, a mark at four corners of a chip is also detected, to correct chip shape. Following this alignment, the pattern is projected onto the wafer 200 under exposure.

In a case of electron-beam exposure, however, during exposure a drift in position of the scanning electron-beam 202 may develop due to charge-up (charging of vaporized resist when it is stuck to an inner wall) of a column (lens-barrel), fluctuations in an external magnetic field, wafer charge-up (charging due to electron-beam irradiation), or like.

FIG. 9 shows an example of positional drift of the scanning electron-beam 202. A dotted line indicates a case with no positional drift and a solid line, a case with positional drift. Misalignment in superposing occurs if an amount of positional drift of the scanning electron-beam 202 is not negligible during a time from termination of detection of the alignment mark 201 to termination of exposure.

One proposal to solve this problem is disclosed in Japanese Patent Application Laid-open No. Sho 61-142740. By this electron-beam exposure method, a position detecting mark is set on the chip beforehand and is used to perform first positional detection, which is followed by electron-beam exposure onto the chip to subsequently perform second positional detection, to obtain drift amount in position between first and second positional detection operations, based on which drift amount is calculated an exposure-position correction amount as a time-wise function of exposure processing so that it may be reflected on a next operation of electron-beam exposure.

Also, a method of correcting exposure position by detecting a plurality of standard marks provided on the X/Y stage is disclosed in Japanese Patent No. 2788139 (Japanese Patent Application Laid-open No. Hei 5-84246). This method is described as follows.

FIG. 10 shows an electron-beam exposure method by use of the above-mentioned standard marks.

First, a wafer is set on an X/Y stage in an electron-beam drawing apparatus (step 301). Next, a plurality of standard marks (reference marks) formed on the X/Y stage is detected by electron-beam exposure, to store in a memory thus detected position of the standard marks (step 302). Based on detected results of the standard marks (shift amount, magnification, rotation amount, and other conditions), a correction factor is calculated, based on which is performed alignment (step 303). Next, exposure is started to detect the standard marks on the X/Y stage in a certain lapse of time from the exposure starting (for example, in 2–3 minutes) (step 304), to obtain a difference between these results of detection and those obtained at step 302 (step 305). This difference in detected results provides an electron-beam positional drift amount produced from a time point before exposure up to a time point when the standards marks are detected again. This drift amount is superimposed onto a deflection amount of the scanning electron-beam, based on results of which is corrected the position of electron-beam exposure (step 306). Then, it is checked whether a certain lapse of time has passed (step 307) and, if it is decided not so, the exposure is permitted to continue. If it is decided so, on the other hand, it is then checked whether exposure operations are all completed (step 308) and, if it is decided not so, the standard marks are detected again (step 309). Then, the process returns to step 304 to perform subsequent processing repeatedly for next exposure operations.

According to an another conventional electron-beam exposure method, however, by the method disclosed in Japanese Patent Application Laid-open No. Sho 61-142740, based on a drift amount obtained on a basis of the second position detection, a subsequent positional correction amount is determined as a time-wise function, so that any increase in number of chips on the semiconductor wafer or number of times of superposing increases a drift amount in position, thus deteriorating the alignment accuracy.

Also, by the electron-beam exposure method shown in FIG. 10, a drift amount is calculated by detecting the standard marks provided on the X/Y stage, so that wafer charge-up prevents accurate detection of drift in the electron-beam position, thus making it impossible to obtain a sufficient degree of accuracy in alignment.

SUMMARY OF THE INVENTION

In view of the above, it is an object of the invention to provide an electron-beam exposure method which can correct position of an electron-beam based on an amount of position of the electron-beam, while reflecting charge-up of a semiconductor wafer used, thus obtaining a sufficient degree of alignment accuracy in superposing.

According to an aspect of the present invention, there is provided an electron-beam exposure method for exposing a semiconductor wafer with a plurality of alignment marks formed thereon, by performing deflecting scanning by use of an electron-beam according to a desired wiring pattern, including steps of:

detecting positions of the plurality of alignment marks before exposure is started, to correct an error in chip array;

detecting a position of a specific alignment mark selected from the plurality of alignment marks at predetermined timing after exposure is started;

calculating an electron-beam positional drift amount based on a positional difference between the position of the specific alignment mark detected at the predetermined timing and the position of the specific alignment mark before the exposure is started;

superimposing the electron-beam positional drift amount onto a deflection amount of the electron-beam, to correct an exposure position for subsequently performing exposure of the semiconductor wafer; and until the exposure of the semiconductor wafer is completed, repeatedly performing, a plurality of times, exposure of the semiconductor wafer at predetermined timing based on correction of the exposure position of the semiconductor wafer.

In the foregoing, a preferable mode is one wherein detection of the position of the specific alignment mark after exposure is started is performed on a same alignment mark selected from the plurality of alignment marks.

Also, a preferable mode is one wherein detection of the position of the specific alignment mark after exposure is started is performed on such an alignment mark that is nearest a position of exposure in process selected from the plurality of alignment marks.

Also, a preferable mode is one wherein the predetermined timing is a constant time interval.

Also, a preferable mode is one wherein the predetermined timing is either timing when exposure is terminated for each of chips formed on the wafer or timing when exposure is terminated for each stripe on the wafer.

With the above configuration, first the positions of a plurality of alignment marks are detected before exposure is started, to thereby perform alignment and, at a same time, thus detected positions of the alignment marks provide data for comparison used to obtain an amount of drift in the position of the electron-beam. After exposure is started, the position of a specific alignment mark of the above-mentioned plurality of alignment marks is detected at predetermined timing, so that its difference from the position detected before exposure may give an amount of drift in the electron-beam position. This electron-beam positional drift amount is superimposed onto an amount of deflection of the electron-beam, to correct the exposure position, thereby performing correct exposure. Then, until exposure of the above-mentioned semiconductor wafer is completed, positional correction of the electron-beam is repeated at the predetermined timing by detecting the alignment marks. Thus, the electron-beam position can be corrected reflecting wafer charge-up, thus obtaining a sufficient degree of accuracy in alignment.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1:
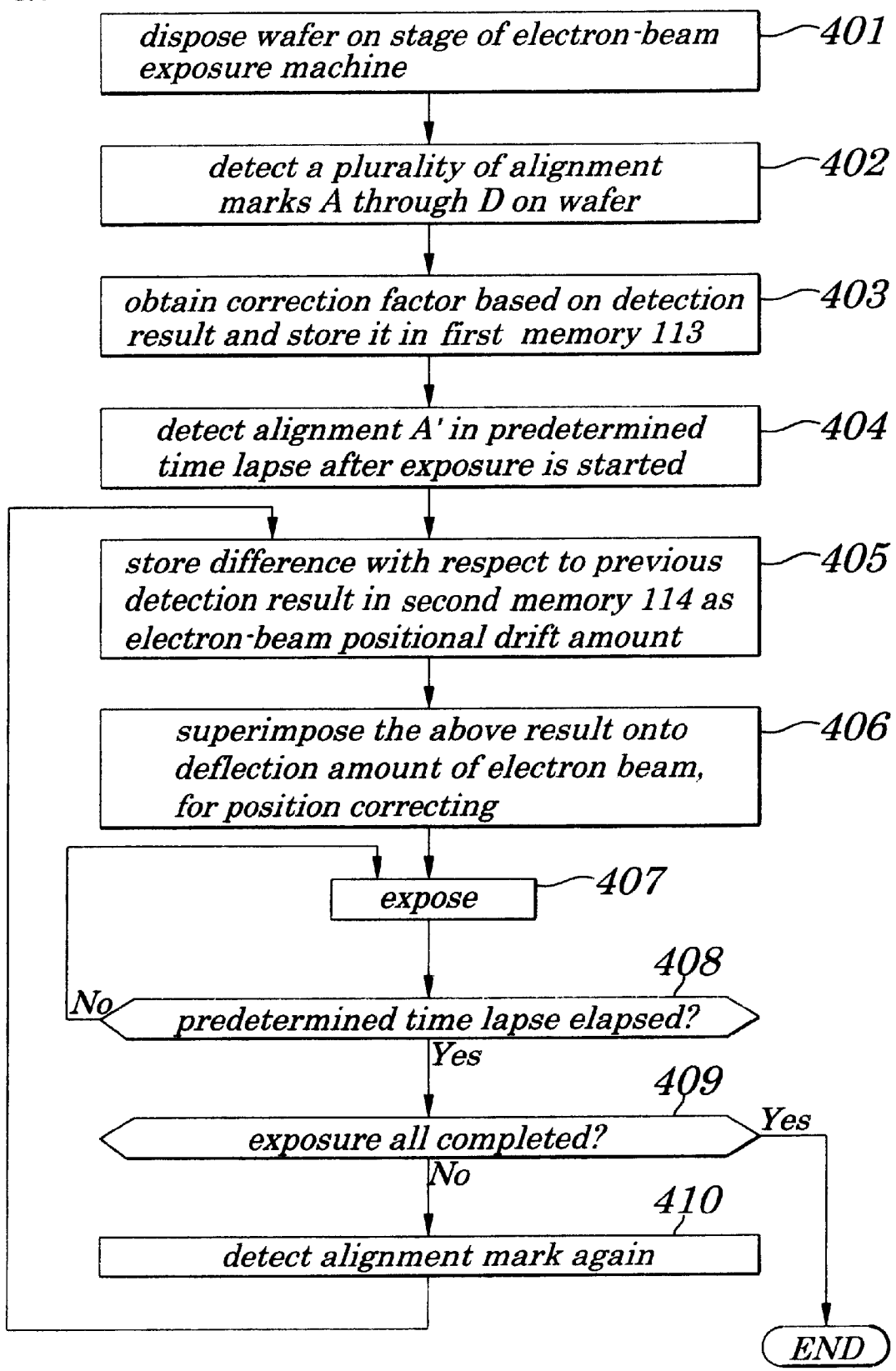
FIG. 1 is a flowchart showing an electron-beam exposure method according to the embodiments of the present invention.
Figure 2:
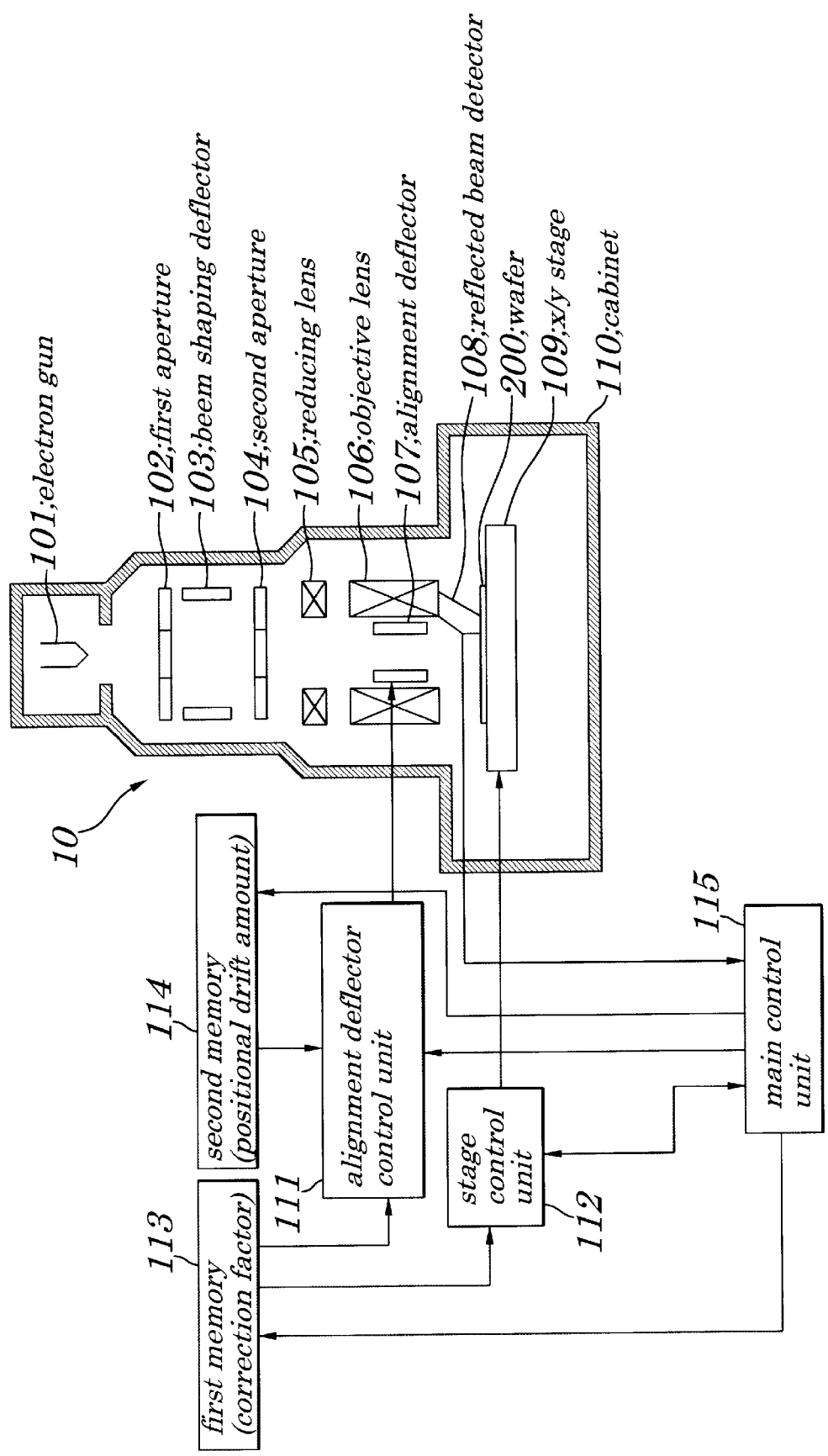
FIG. 2 is a configuration diagram showing an electron-beam exposure apparatus used in the embodiments of the present invention.

The following will describe a first embodiment of the invention with reference to FIG. 1 and FIG. 2.

Figure 6:
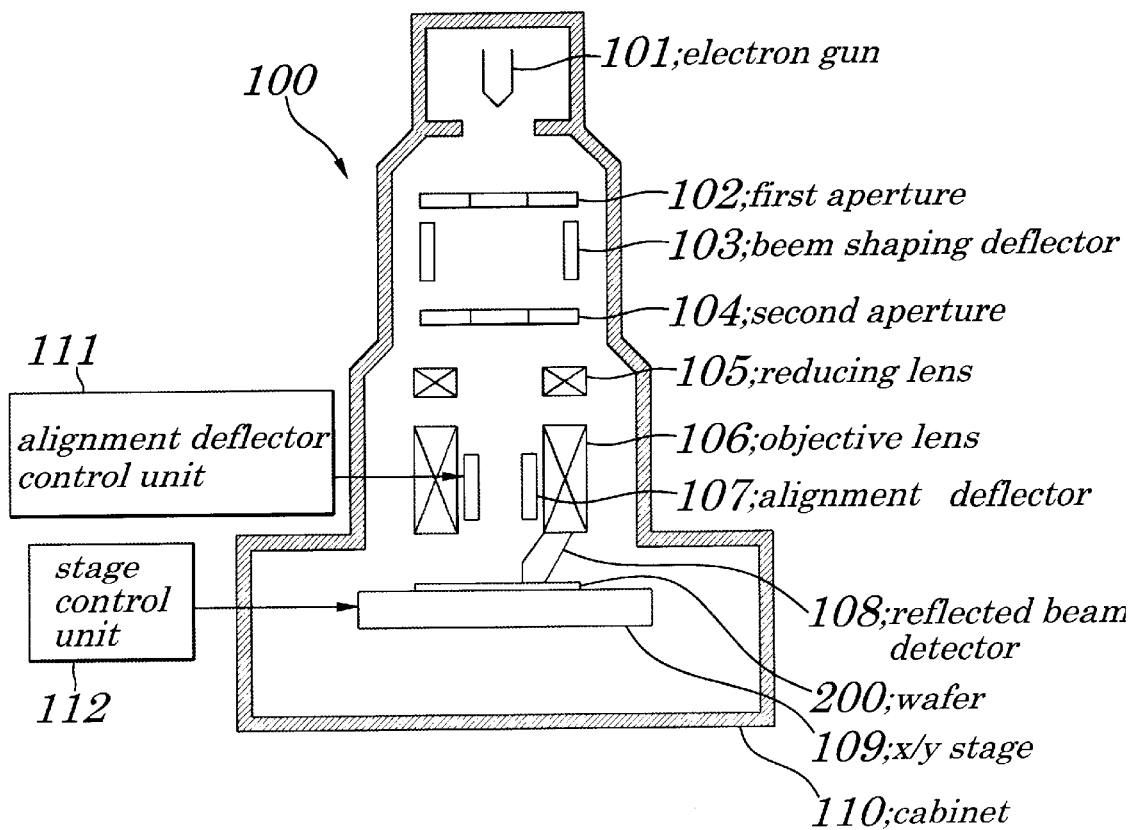
FIG. 6 is a configuration diagram showing a conventional electron-beam exposure apparatus to which a conventional electron-beam exposure method is applied.
Figure 7:
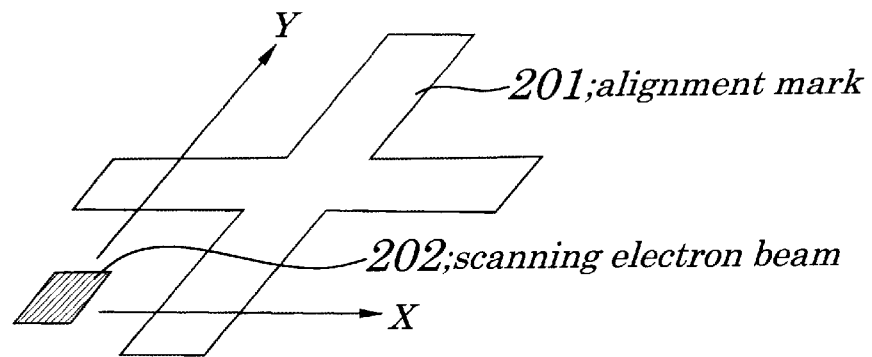
FIG. 7 is a perspective view showing an alignment mark provided to each of a plurality of chips on a wafer in the conventional technology.
Figure 8:
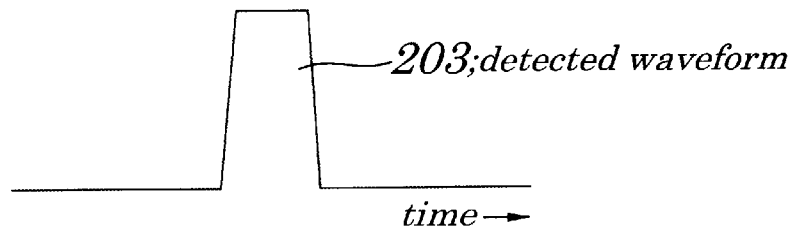
FIG. 8 explains a waveform of a detected signal obtained by a reflected electron detector of FIG. 6 and an alignment mark to be detected thereby in the conventional technology.
Figure 8:
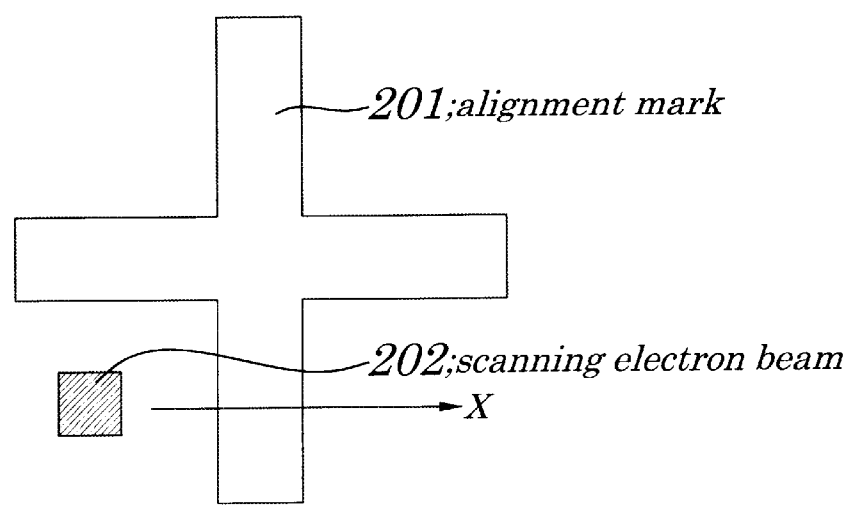
Figure 9:
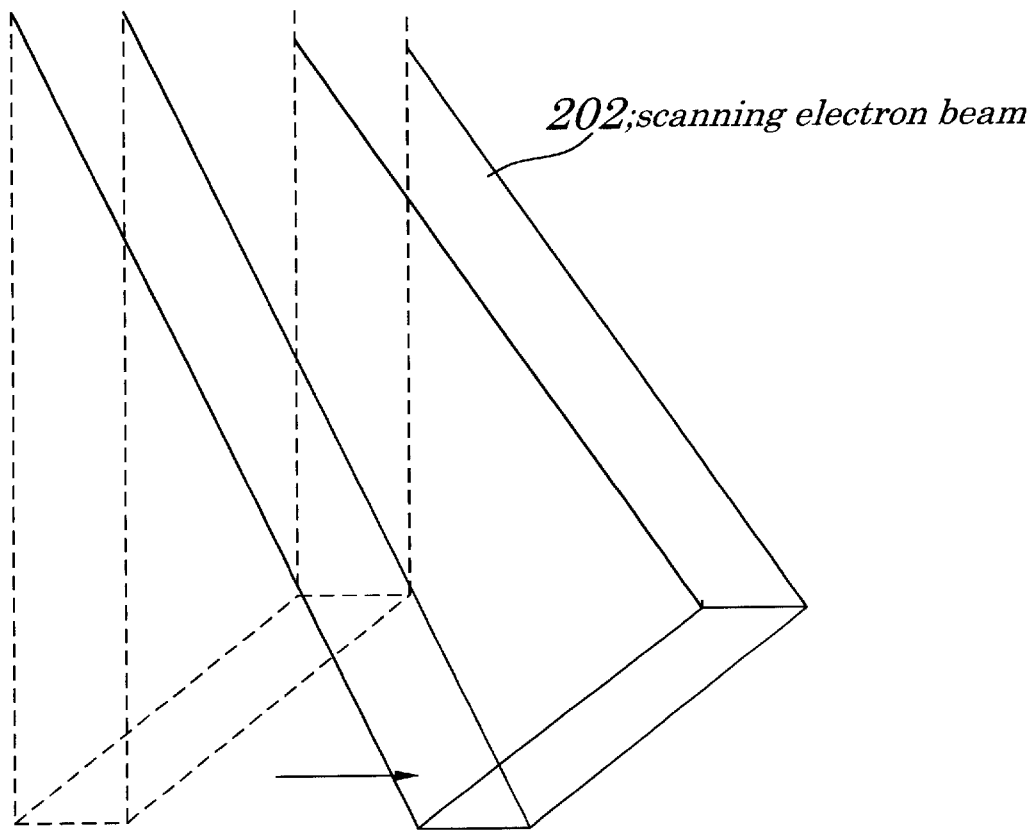
FIG. 9 explains drift in position of a scanning electron-beam in the conventional technology.
Figure 10:
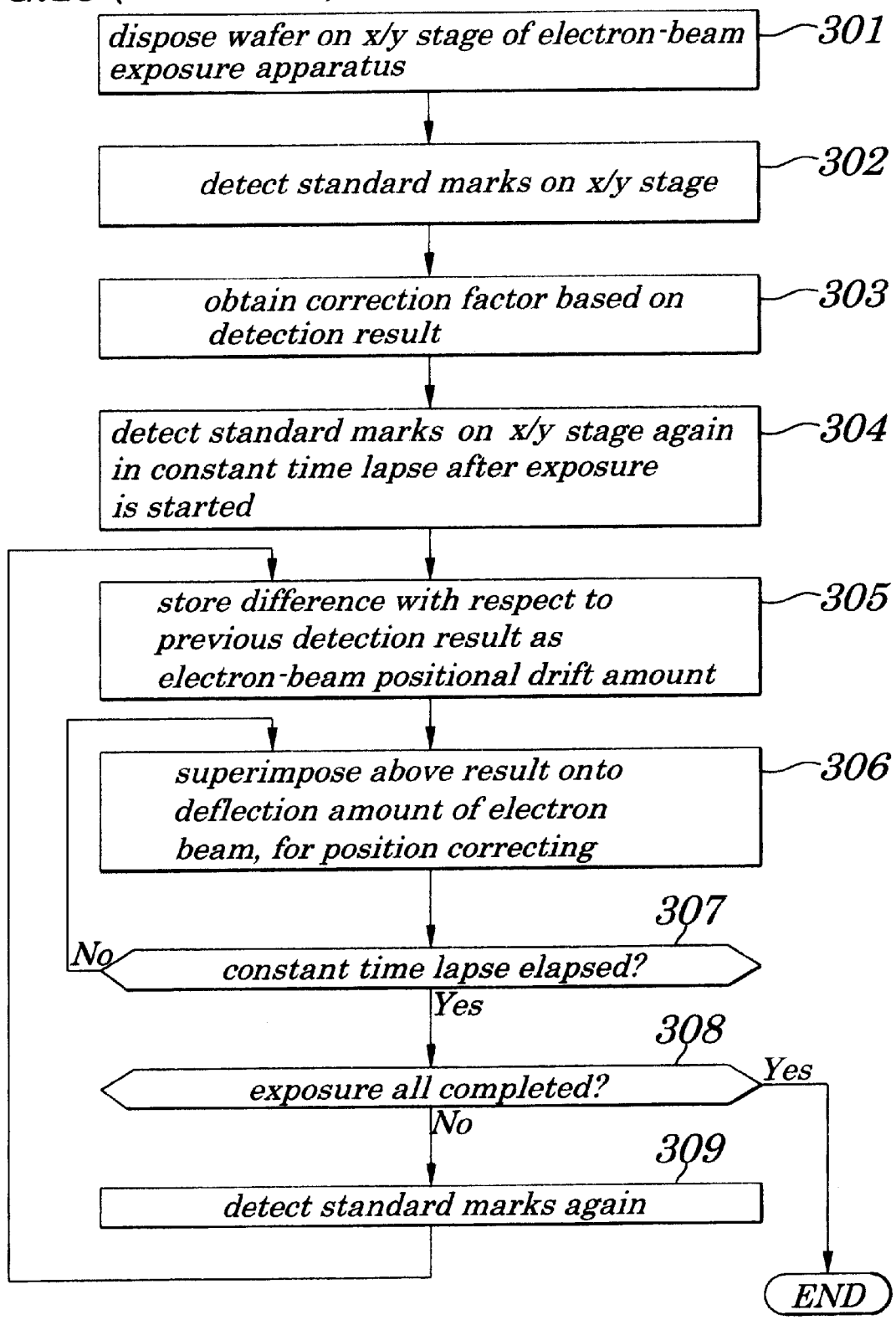
FIG. 10 is a flowchart showing an another conventional electron-beam exposure method by use of standard marks.

In FIG. 2, same elements as those shown in FIG. 6 are indicated by same reference numerals and so same descriptions are omitted here. An electron-beam exposure apparatus 10 of the invention has same configuration as that shown in FIG. 6 except that it has a main control unit 115 for controlling entire electron-beam exposure apparatus besides a first memory 113 for storing a correction factor, second memory 114 for storing an amount of drift in position of electron-beam position, alignment deflector control unit 111, and stage control unit 112. The main control unit 115 comprises a CPU for executing various processing steps shown in FIG. 1 to store calculated values of the correction factor and electron-beam positional drift amount in the first memory 113 and second memory 114 respectively. Operations shown in FIG. 2 as a whole are same as those described with FIG. 6 and so their descriptions are omitted here.

Figure 3:
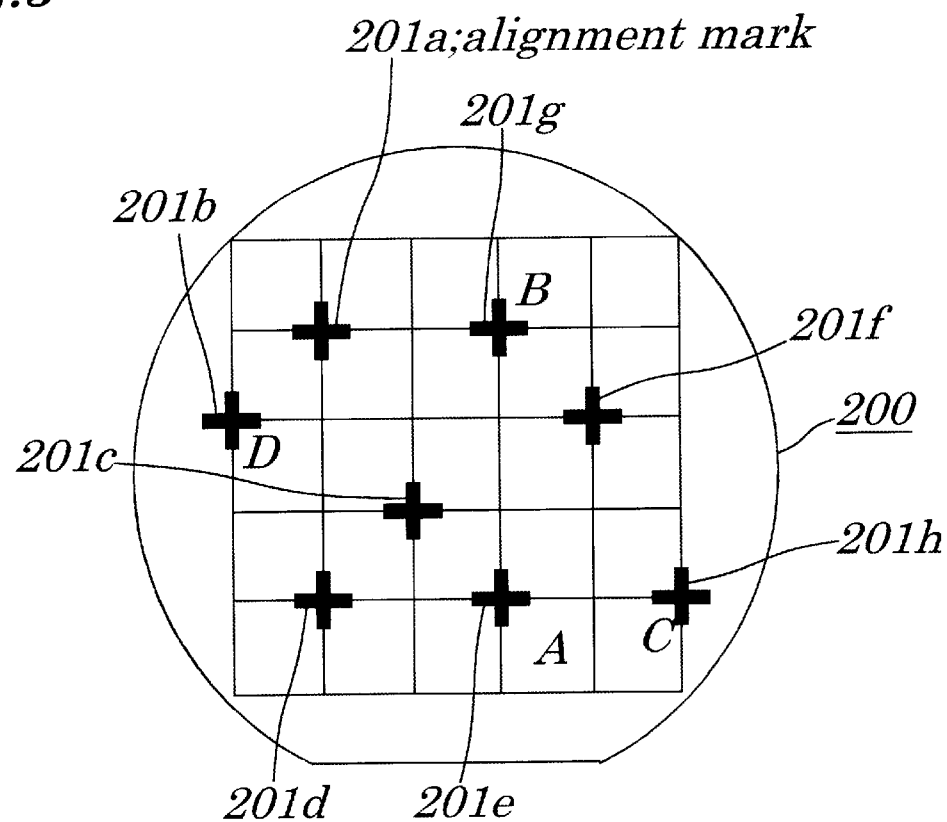
FIG. 3 is a plan view showing an example of arraying alignment marks on a wafer according to the embodiments of the present invention.
Figure 4:
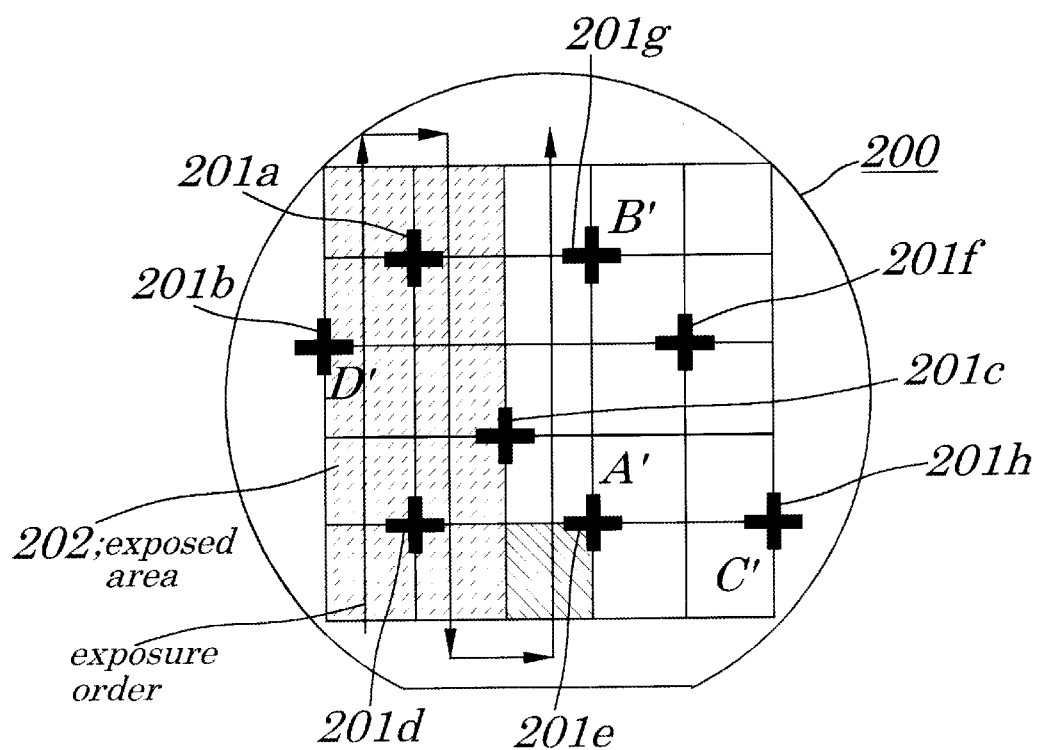
FIG. 4 explains an order of exposure on the wafer of FIG. 3.

FIG. 3 shows an example of arrangement of alignment marks on wafer 200 and FIG. 4, an order of exposure on the wafer 200. They show how to correct beam drift according to the invention. In FIG. 3, each square indicates a chip.

The following will describe an electron-beam exposure method according to the first embodiment of the invention with reference to FIGS. 1 to 4. First, a wafer is put on X/Y stage 109 of the electron-beam exposure apparatus 10 shown in FIG. 2 (step 401). Next, as shown in FIG. 3, of alignment marks 201a through 201h (of which those used in this embodiment are designated by A, B, C and D) arranged over the chips on the wafer 200, a plurality of alignment marks (four marks indicated by A, B, C and D here) is detected (step 402). With results of this detection, by the global alignment method, a shift in chip array on the wafer 200, a gain (magnification), and a rotation (degree of rotation) are calculated to obtain a correction factor (step 403). And based on this correction factor the alignment is performed. The correction factor obtained at step 403 is saved in the first memory 113 by the main control unit 115. Then, the wafer 200 starts to be exposed to an electron-beam. FIG. 4 shows a state where exposure started from a first leftmost column and has covered a second leftmost column, shaded portions indicating those areas that have undergone exposure.

Then, when a predetermined time "t" has elapsed after exposure started (for example, after a constant time of a few minutes has elapsed or during an appropriate exposure-stopped duration), exposure is stopped and one alignment mark A (201e) of those detected at step 402 is detected again (step 404), to obtain a coordinates difference ($\Delta X$, $\Delta Y$) between coordinates of the alignment mark A obtained at step 402 and those of an alignment mark A' obtained at this second time detection (step 405). This drift amount of the electron-beam position is saved in the second memory 114 by the main control unit 115. A coordinates difference ($\Delta X$, $\Delta Y$) obtained at step 405 provides an electron-beam positional drift amount. This electron-beam positional drift amount is superimposed as an electron-beam positional drift amount during exposure onto an electron-beam deflection amount, to correct position of the electron-beam (step 406), thus performing exposure (step 407). When the predetermined time t has elapsed during this exposure (step 409), the process returns to step 404 to detect the alignment mark A' again. At step 405, the coordinates difference ($\Delta X$, $\Delta Y$) with respect to the alignment mark A' detected at step 404 previously, to thereby correct the position (step 406), for performing exposure (step 407). In exposure, there is some restriction on deflection range of the electron-beam exposure apparatus, so that if an exposure object goes far away from exposure center, the X/Y stage is moved as necessary. During exposure, it is checked whether the predetermined time has elapsed (step 408) and if it is decide not so, the process returns to step 407 to continue exposure. If it is decided so at step 408, on the other hand, it is checked whether subsequent exposure is to be performed (step 409) and if it is decided so, the alignment mark A' is detected again (step 410) to return the process to step 405, for repeatedly performing the above-mentioned detection, correction, and exposure operations. When exposure has been completed on all the chips of the wafer 200 (step 409), the processing is terminated.

Figure 5:
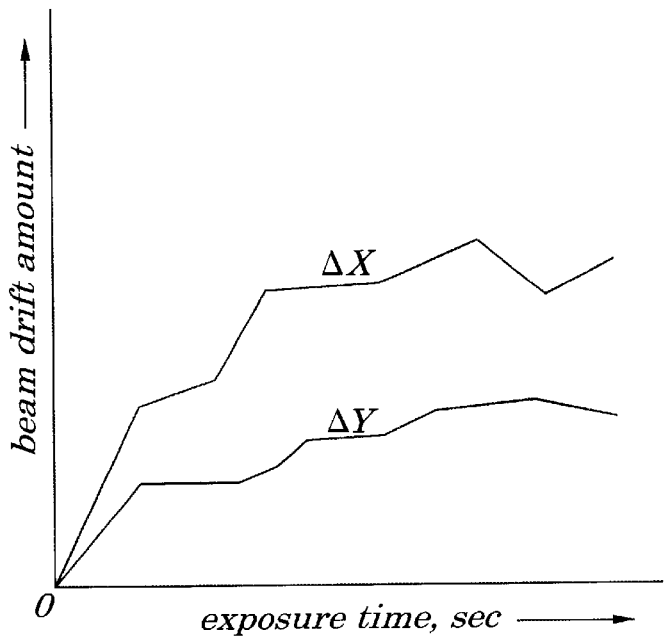
FIG. 5 is a graph indicating a beam drift amount vs. exposure time according to the embodiments of the present invention.

FIG. 5 shows changes in a beam drift amount (electron-beam positional drift amount) in the first embodiment. FIG. 5 specifically shows how electron-beam positional drift amounts $\Delta X$ and $\Delta Y$ calculated at step 405 change each time of detection as time passes after exposure is started. A reason for this change is that charge-up of the wafer 200 increases as time passes in exposure. If exposure is performed ignoring those changes in $\Delta X$ and $\Delta Y$, the scanning position of the scanning electron-beam is shifted by as much as those changes. As shown at step 406, however, by superimposing $\Delta X$ and $\Delta Y$ onto a deflection amount of the scanning electron-beam, the position can be corrected, to maintain a sufficient level of positioning accuracy even with a larger number of times of superposing.

As described above, according to the invention, it is possible to correct a drift in the position of an electron-beam caused by charge-up of the wafer, thus improving the accuracy of alignment in superposing.

Note here that at step 402 the alignment mark can be detected more than one at a time in the same chip as necessary. Also, although the alignment mark A has been detected to completion, any other alignment mark may be used instead during course of detection. Similarly, detection interval may also be changed during detection.

Further, although in FIG. 1 timing for measuring the electron-beam positional drift amount has been set at each constant interval, the timing is not limited to that but may be set at termination of exposure for each chip, at termination of exposure for each column shown in FIG. 4, or at termination of exposure for each stripe (that is, each column consisting of vertical chips in the deflection area of the electron-beam shown in FIG. 4).

Second Embodiment

The following will describe a second embodiment of the invention.

Although in the first embodiment an alignment mark to be detected again has been same as that detected previously, in the second embodiment, as the alignment mark to be detected again, such an alignment mark that is nearest a chip to be exposed next may be used. In FIG. 3, of 5×5 (=25) chips arrayed on wafer 200, leftmost two columns are already exposed (exposed area 202), leaving third column having chips yet to be exposed. As for re-detection of alignment marks, alignment mark 201 is detected again each time one column of chips on the wafer 200 is exposed completely. As shown in FIG. 3, second leftmost column has been exposed, and then an alignment mark (A') nearest a lowermost chip (rightward-declining hatched line segment) in the third column exposed next is detected to measure drift in electron-beam position. When the third column is exposed completely next, an alignment mark B' is detected and, when a fourth column is exposed completely next, an alignment mark C' is detected.

According to this embodiment, alignment can be corrected with an improved accuracy even if charge-up is non-uniform on surface of the wafer 200.

Third Embodiment

The following will describe a third embodiment of the invention.

This embodiment is a variant of the first embodiment, with a difference in processing at step 402. In the first embodiment, at step 402, a plurality of alignment marks D through C are detected sequentially as shown in FIG. 4. In this case, each of alignment marks takes a few seconds to ten seconds and more for its detection, thus taking a considerable lapse of time to detect all of these alignment marks. Therefore, when one alignment is being detected, charge-up increases on the wafer 200, thus rendering meaningless results of a previously detected alignment mark. To guard against this, in the third embodiment, during course of detecting the plurality of alignment marks, previously detected alignment mark D is detected again for each constant interval, to obtain a correct correction factor.

Thus, by detecting again the alignment mark detected initially when the plurality of alignment marks is detected at step 402, an electron-beam positional drift caused by changes in charge-up on the wafer 200 in a course of time when alignment marks A, B, and C are detected can be corrected, thus detecting these alignment marks with an improved accuracy. As a result, a correct reference value for comparison at step 405 can be obtained, thus providing a more accurate amount of electron-beam positional drift.

Although in FIG. 4 only an alignment mark D' has been detected already and so has been employed, an alignment mark A' for example may be detected again if only an alignment mark C' is not detected yet.

As described above, according to the electron-beam exposure method of the invention, positions of a plurality of alignment marks on a wafer are detected before exposure is started, so that position of a specific one of the above-mentioned plurality of alignment marks is detected at predetermined timing after start of exposure to measure as an electron-beam positional drift amount a positional shift amount of the specific alignment mark observed between its pre-exposure position and its post-exposure position, which drift amount is in turn superimposed onto a deflection amount of electron-beam to correct exposure position for next exposure and also to repeatedly calculate electron-beam positional drift amount at predetermined timing until the above-mentioned semiconductor wafer is exposed completely, thereby making it possible to correct electron-beam position as reflecting charge-up on the semiconductor wafer and to obtain a sufficient degree of accuracy in superposing alignment.

What is claimed is:

1. An electron-beam exposure method for exposing a semiconductor wafer with a plurality of alignment marks formed thereon, by performing deflecting scanning by use of an electron-beam according to a desired wiring pattern, comprising steps of:

detecting positions of said plurality of alignment marks before exposure is started, to correct an error in chip array;

detecting a position of a specific alignment mark selected from said plurality of alignment marks at predetermined timing after said exposure is started;

calculating an electron-beam positional drift amount based on a positional difference between said position of said specific alignment mark detected at said predetermined timing and a position of said specific alignment mark before said exposure is started;

superimposing said electron-beam positional drift amount onto a deflection amount of an electron-beam, to correct an exposure position for subsequently performing exposure of said semiconductor wafer;

until said exposure of said semiconductor wafer is completed, repeatedly performing, a plurality of times, exposure of said semiconductor wafer at predetermined timing based on correction of said exposure position of said semiconductor wafer; and wherein detection of said position of said specific alignment mark after exposure is started is performed on such an alignment mark that is nearest a position of exposure in process selected from said plurality of alignment marks.

2. The electron-beam exposure method according to claim 1, wherein said predetermined timing is a constant time interval.

3. An electron-beam exposure method for exposing a semiconductor wafer with a plurality of alignment marks formed thereon, by performing deflecting scanning by use of an electron-beam according to a desired wiring pattern, comprising steps of:

detecting positions of said plurality of alignment marks before exposure is started, to correct an error in chip array;

detecting a position of a specific alignment mark selected from said plurality of alignment marks at predetermined timing after said exposure is started;

calculating an electron-beam positional drift amount based on a positional difference between said position of said specific alignment mark detected at said predetermined timing and a position of said specific alignment mark before said exposure is started;

superimposing said electron-beam positional drift amount onto a deflection amount of an electron-beam, to correct an exposure position for subsequently performing exposure of said semiconductor wafer;

until said exposure of said semiconductor wafer is completed, repeatedly performing, a plurality of times, exposure of said semiconductor wafer at predetermined timing based on correction of said exposure position of said semiconductor wafer; and wherein said predetermined timing is either timing when exposure is terminated for each of chips formed on said wafer or timing when exposure is terminated for each stripe on said wafer.

4. The electron-beam exposure method according to claim 3, wherein detection of said position of said specific alignment mark after exposure is started is performed on such an alignment mark that is nearest a position of exposure in process selected from said plurality of alignment marks.

5. The electron-beam exposure method according to claim 3, wherein detection of said position of said specific alignment mark after exposure is started is performed on a same alignment mark selected from said plurality of alignment marks.

* * * * *